(12) United States Patent
Akiba et al.

(10) Patent No.: US 7,947,555 B2
(45) Date of Patent: May 24, 2011

(54) METHOD OF MAKING SILICON CARBIDE SEMICONDUCTOR DEVICE

(75) Inventors: Atsuya Akiba, Kariya (JP); Eiichi Okuno, Mizuho (JP)

(73) Assignee: Denso Corporation, Kariya (JP)

( * ) Notice: Subject to any disclaimer, the term of this patent is extended or adjusted under 35 U.S.C. 154(b) by 55 days.

(21) Appl. No.: 12/385,519

(22) Filed: Apr. 9, 2009

(65) Prior Publication Data

US 2009/0280609 A1    Nov. 12, 2009

(30) Foreign Application Priority Data

Apr. 14, 2008   (JP) .................... 2008-104606

(51) Int. Cl.
   *H01L 21/336*   (2006.01)
(52) U.S. Cl. ........ 438/270; 438/268; 438/197; 257/218; 257/403
(58) Field of Classification Search .......... 438/268, 438/270, 197; 257/218, 403, 328, E21.41
See application file for complete search history.

(56) References Cited

U.S. PATENT DOCUMENTS

| 5,744,826 A | 4/1998 | Takeuchi et al. |
| 6,133,587 A | 10/2000 | Takeuchi et al. |
| 2009/0200559 A1* | 8/2009 | Suzuki et al. .............. 257/77 |
| 2009/0311839 A1* | 12/2009 | Miyahara et al. ........... 438/270 |

OTHER PUBLICATIONS

U.S. Appl. No. 12/379,076, filed Feb. 12, 2009, Suzuki et al.
U.S. Appl. No. 12/289,624, filed Oct. 30, 2008, Suzuki et al.

* cited by examiner

*Primary Examiner* — Theresa T Doan
(74) *Attorney, Agent, or Firm* — Posz Law Group, PLC

(57) ABSTRACT

In a method of making a silicon carbide semiconductor device having a MOSFET, after a mask is placed on a surface of a first conductivity type drift layer of silicon carbide, ion implantation is performed by using the mask to form a lower layer of a deep layer extending in one direction. A first conductivity type current scattering layer having a higher concentration than the drift layer is formed on the surface of the drift layer. After another mask is placed on a surface of the current scattering layer, ion implantation is performed by using the other mask to form an upper layer of the deep layer at a position corresponding to the lower layer in such a manner that the lower layer and the upper layer are connected together.

6 Claims, 9 Drawing Sheets

METHOD OF MAKING SILICON CARBIDE SEMICONDUCTOR DEVICE

CROSS REFERENCE TO RELATED APPLICATION

This application is based on and incorporates herein by reference Japanese Patent Application No. 2008-104606 filed on Apr. 14, 2008.

FIELD OF THE INVENTION

The present invention relates to a method of making a silicon carbide (SiC) semiconductor device having a trench gate.

BACKGROUND OF THE INVENTION

In recent years, SiC has attracted attention as a material for a power device having high electric field breakdown strength. A SiC semiconductor device can control a large electric current due to its high electric field breakdown strength. Therefore, the SiC semiconductor device is expected to be used to control a motor of a hybrid vehicle.

Increasing channel density is an effective way to allow a larger electric current to flow in a SiC semiconductor device. Therefore, in a silicon transistor, a MOSFET having a trench-gate structure has been adopted and put to practical use. A trench-gate structure can be applied to a SiC semiconductor. However, there is a big problem, when the trench-gate structure is applied to SiC. That is, since electric field breakdown strength of SiC is ten times greater than that of silicon, a voltage applied to a SiC semiconductor device during use is approximately ten times greater than a voltage applied to a silicon device during use. Therefore, a voltage applied to a gate insulating film formed in a trench in SIC is approximately ten times greater than a voltage applied to a gate insulating film formed in a silicon device. As a result, it is likely that a breakdown of the gate insulating film occurs at a corner of the trench. A result of a simulation regarding this indicates that when a voltage of 650V is applied to a drain, an electric field of 4.9 MV/cm acts on a gate insulating film in a trench. For practical use, the electric field needs to be equal to or less than of 3 MV/cm. When taking into consideration long-term reliability, it is preferable that the electric field be equal to or less than of 2 MV/cm.

U.S. Pat. No. 6,133,587 (JP-A-H9-199724) discloses a SiC semiconductor device designed to solve the above problem. In this SiC semiconductor device, the thickness of a bottom wall of a trench is made greater than the thickness of a side wall of the trench to relieve electric field concentration on the bottom wall of the trench. Specifically, a a-face (1120) trench gate structure is formed by using a c-face (000-1) substrate of 4H-SiC. That is, a trench having a a-face side wall and a c-face bottom wall is formed by using the c-face substrate. When a gate insulating layer is formed in the trench by thermal oxidation, an oxidation rate of the c-face is five times greater than that of the a-face. Accordingly, the thickness of the gate insulating layer in the trench becomes five times greater on the trench bottom wall than on the trench side wall. Therefore, the electric field concentration on the trench bottom wall can be reduced.

In a simulation, the thickness of the gate insulating layer on the trench side wall is set to 40 nm, the thickness of the gate insulating layer on the trench bottom wall is set to 200 nm, and a voltage of 650V is applied to a drain. The simulation result indicates that the electric field concentration on the gate insulating layer in the trench is reduced to 3.9 MV/cm. However, the reduction in the electric field concentration is insufficient, and a further reduction is required.

The present inventors have filed the patent application (Japanese patent application No. 2007-288545) for a structure for achieving further electric field concentration reduction. The structure has a p-type deep layer that is located opposite side of a trench gate across an $n^+$-type source region and a p-type base region. That is, the p-type deep layer is located under a $p^+$-type contact region that is electrically connected to the p-type base region and a source electrode. The p-type deep layer extends deeper than a bottom wall of the trench gate.

When the SiC semiconductor device having this structure is manufactured, the trench gate and the p-type deep layer are formed by different processes. Since alignment between the trench gate and the p-type deep layer is difficult, there may occur a certain amount of variation in a distance from a side wall of the trench gate to the p-type deep layer. As a result, characteristic variations between products may occur, and yield rates may be low.

The present inventors have filed another patent application (Japanese patent application No. 2008-31704) for a structure in which a p-type deep layer extends in a direction normal to a potion of a trench side wall where a channel region is formed. In the structure, since a depletion layer greatly extends toward an $n^-$-type drift layer side at a PN junction between the p-type deep layer and the $n^-$-type drift layer, it is less likely that a high voltage due to a drain voltage is applied to a gate oxide layer. Thus, electric field concentration in the gate oxide layer can be reduced, in particular, on the bottom wall of the trench, so that a breakdown of the gate oxide layer can be prevented. In addition, since a longitudinal direction of the trench is not perpendicular to a longitudinal direction of the p-type deep layer, device characteristics are not affected by misalignment between masks used to form the trench and the p-type deep layer.

Further, it has been proposed that an n-type current scattering layer is formed between an $n^-$-type layer and a p-type base layer to further reduce an on-resistance. The n-type current scattering layer allows an electric current passing through the channel region to be widely scattered so that the electric current can flow though the $n^-$-type drift layer. In this way, the on-resistance is further reduced. In such a structure, when a p-type base region and the p-type deep layer are divided by the n-type current scattering layer, the effect of reducing the electric field concentration may be weakened due to the fact that the p-type deep layer is not fixed to a source potential. Therefore, it has been proposed that the p-type layer is formed by performing ion implantation of p-type impurities into a surface of the n-type current scattering layer after the n-type current scattering layer is formed.

However, in a case where the p-type layer is formed by performing ion implantation of p-type impurities into the surface of the n-type current scattering layer after the n-type current scattering layer is formed, the depth of the p-type deep layer becomes small. Accordingly, a difference in depth between a bottom wall of the p-type deep layer and a bottom wall of the trench becomes small so that the effect of reducing the electric field concentration may be reduced. Further, since it is difficult to control the depth of the trench, there is a possibility that the depth of the trench becomes greater than the depth of the p-type deep layer. Since the depth of the p-type deep layer depends on energy of the ion implantation, the depth of the p-type deep layer can be increased by performing the ion implantation at high energy. However, an enormous amount of energy is required to form the p-type deep layer having a desired depth in a solid material such as SiC. Therefore, there is a need to prepare an ion implantation apparatus that can perform ion implantation by using an enormous amount of energy. However, since such an ion implantation apparatus is costly, another approach is required.

SUMMARY OF THE INVENTION

In view of the above, it is an object of the present invention to provide a method of making a SiC semiconductor apparatus having a structure for reducing electric field concentration in a gate oxide layer formed in a trench. In the structure, a base layer is connected to a deep layer. The method ensures that the deep layer is deeper than the trench.

According to an aspect of the present invention, a method of making a silicon carbide semiconductor device having an accumulation mode MOSFET, in which an accumulation mode channel formed in a channel layer by control of an application voltage to a gate electrode is controlled so that an electronic current flows between a source electrode and a drain electrode through a source region and a drift layer, includes preparing a substrate and forming the drift layer on the substrate. The drift layer is made of silicon carbide and has the first conductivity type. An impurity concentration of the drift layer is lower than an impurity concentration of the substrate. The method further includes placing a mask on a surface of the drift layer and then performing ion implantation by using the mask to form a lower layer of a deep layer extending in one direction. The deep layer has the first conductivity type. The method further includes forming a current scattering layer on the drift layer. The current scattering layer has the first conductivity type, and an impurity concentration of the current scattering layer is higher than the impurity concentration of the drift layer. The method further includes placing another mask on a surface of the current scattering layer and then performing ion implantation by using the other mask to form an upper layer of the deep layer at a position corresponding to the lower layer in such a manner that the upper layer and the lower layer are connected together. The method further includes forming a base region on the surfaces of the current scattering layer and the deep layer. The base region is made of silicon carbide and has the second conductivity type.

According to another aspect of the present invention, a method of making a silicon carbide semiconductor device having an inversion mode MOSFET in which an inversion mode channel formed in a surface portion of a base region located at a side wall of a trench by control of an application voltage to a gate electrode is controlled so that an electronic current flows between a source electrode and a drain electrode through a source region and a drift layer, includes preparing a substrate and forming the drift layer on the substrate. The drift layer is made of silicon carbide and has the first conductivity type. An impurity concentration of the drift layer is lower than an impurity concentration of the substrate. The method further includes placing a mask on a surface of the drift layer and then performing ion implantation by using the mask to form a lower layer of a deep layer extending in one direction. The deep layer has the first conductivity type. The method further includes forming a current scattering layer on the drift layer. The current scattering layer has the first conductivity type, and an impurity concentration of the current scattering layer is higher than the impurity concentration of the drift layer. The method further includes placing another mask on a surface of the current scattering layer and then performing ion implantation by using the other mask to form an upper layer of the deep layer at a position corresponding to the lower layer in such a manner that the upper layer and the lower layer are connected together. The method further includes forming a base region on the surfaces of the current scattering layer and the deep layer. The base region is made of silicon carbide and has the second conductivity type.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

Embodiments of the present invention are described below with reference to the drawings.

First Embodiment

A first embodiment of the present invention is described. Here, an accumulation-mode trench-gate MOSFET is described as an element provided in a SiC semiconductor device.

Figure 1:
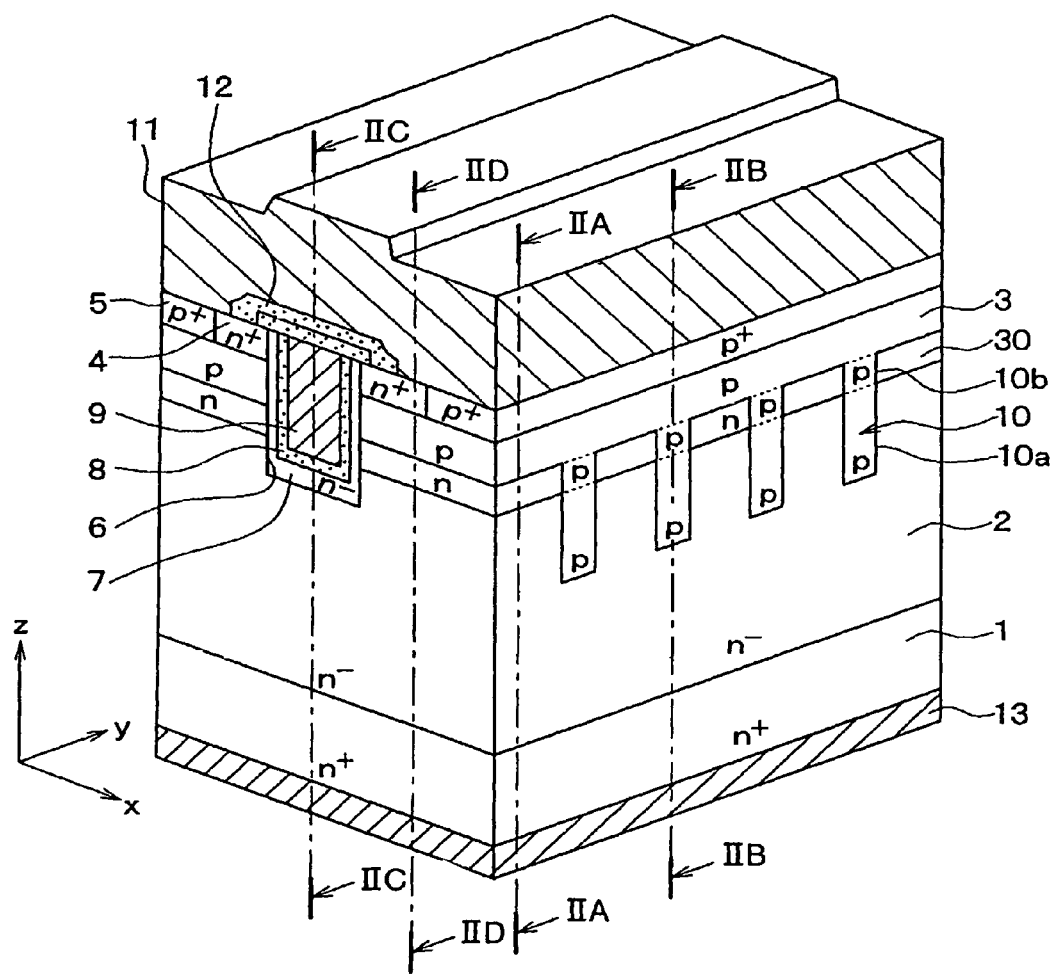
FIG. 1 is a diagram illustrating a cross-sectional view of an accumulation-mode trench-gate MOSFET according to a first embodiment of the present invention.
Figure 2A:
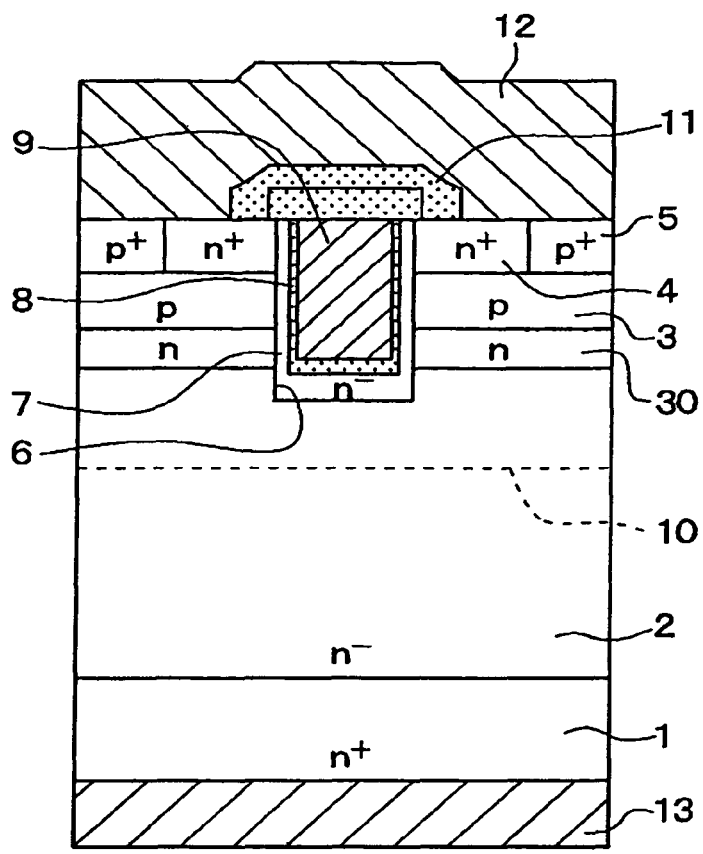
FIG. 2A is a diagram illustrating a cross-sectional view taken along the line IIA-IIA in FIG. 1.
Figure 2B:
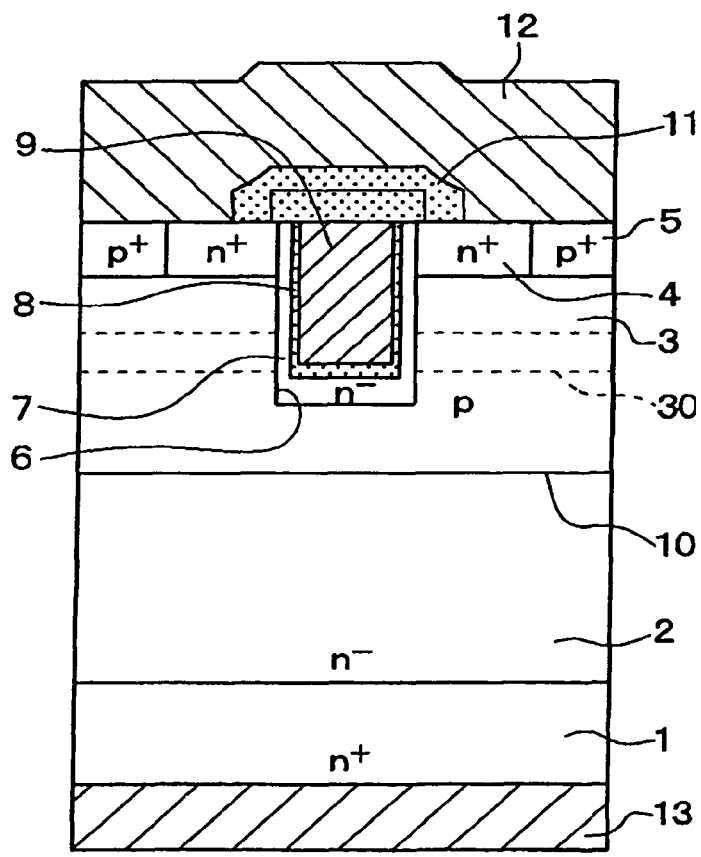
FIG. 2B is a diagram illustrating a cross-sectional view taken along the line IIB-IIB in FIG. 1.
Figure 2C:
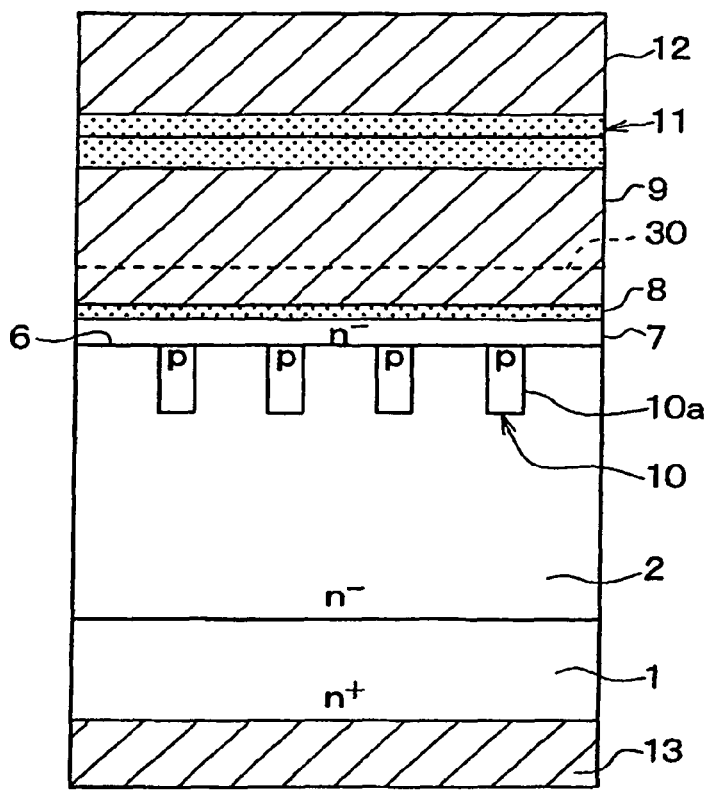
FIG. 2C is a diagram illustrating a cross-sectional view taken along the line IIC-IIC in FIG. 1.
Figure 2D:
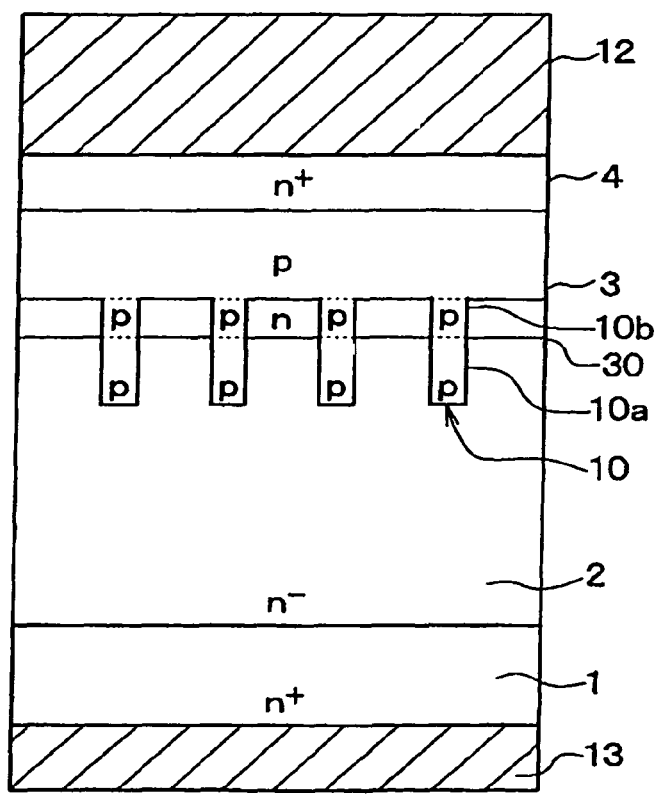
FIG. 2D is a diagram illustrating a cross-sectional view taken along the line IID-IID in FIG. 1.

FIG. 1 is a cross-sectional perspective view of a trench-gate MOSFET according to the present invention. This figure corresponds to one cell of the MOSFET. Although this figure illustrates one cell of the MOSFET, multiple MOSFETs, each of which has the same structure as the MOSFET shown in FIG. 1, are arranged adjacent to each other. FIGS. 2A-2D are diagrams illustrating cross-sectional views of the MOSFET of FIG. 1. FIG. 2A is the cross-sectional view taken along the line IIA-IIA in parallel to the xz plane of FIG. 1. FIG. 2B is the cross-sectional view taken along the line IIB-IIB in parallel to the xz plane of FIG. 1. FIG. 2C is the cross-sectional view taken along the line IIC-IIC in parallel to the yz plane of FIG. 1. FIG. 2D is the cross-sectional view taken along the line IID-IID in parallel to the yz plane of FIG. 1.

The MOSFET shown in FIG. 1 and FIGS. 2A-2D employs an n$^+$-type substrate 1 of SiC as a semiconductor substrate. For example, the n$^+$-type substrate 1 has the thickness of about 300 μm and is doped with an n-type impurity such as phosphorus with a concentration of about $1.0 \times 10^{19}/cm^3$. An n-type drift layer 2 of SiC is formed on a surface of the n$^+$-type substrate 1. For example, the n-type drift layer 2 has the thickness of from about 10 μm to about 15 μm and is doped with an n-type impurity such as phosphorus with a concentration of from about $3.0 \times 10^{15}/cm^3$ to about $7.0 \times 10^{15}$ cm$^3$. The impurity concentration of the n$^-$-type drift layer 2 can be kept unchanged in its thickness direction. It is preferable that the impurity concentration of the n$^-$-type drift layer 2 in its thickness direction be distributed in such a manner that the impurity concentration is higher at a side near the n$^+$-type substrate 1 than at a side far from the n$^+$-type substrate 1. For example, an impurity concentration of a 3 μm-to-5 μm portion of the n$^-$-type drift layer 2 from the surface of the n$^+$-type substrate 1 can be about $2.0 \times 10^{15}/cm^3$ higher than that of any other portion of the n$^-$-type drift layer 2. In such an approach, an inner resistance of the n$^-$-type drift layer 2 is reduced so that an on-resistance can be reduced.

At a surface portion of the n-type drift layer 2, a p-type base region 3 is formed through an n-type current scattering layer 30, which is described later. An n$^+$-type source region 4 and a p$^+$-type body layer 5 are formed on the p-type base region 3.

For example, the p-type base region 3 has the thickness of about 2.0 μm and is doped with a p-type impurity such as boron or aluminum with a concentration of from about $5.0 \times 10^{16}/cm^3$ to about $2.0 \times 10^{19}/cm^3$. For example, the n$^+$-type source region 4 has the thickness of about 0.3 μm and is doped with an n-type impurity such as phosphorus with a concentration (surface concentration) of about $1.0 \times 10^{21}/cm^3$ at its surface portion. For example, the p$^+$-type body layer 5 has the thickness of about 0.3 μm and is doped with a p-type impurity such as boron or aluminum with a concentration (surface concentration) of about $1.0 \times 10^{21}/cm^3$ at its surface portion. The n$^+$-type source region 4 is formed on each side of a trench gate structure, which is described later. The p$^+$-type body layer 5 is located opposite side of the trench gate structure across the n$^+$-type source region 4.

A trench 6 is formed to reach the n$^-$-type drift layer 2 by penetrating the p-type base region 3, the n$^+$-type source region 4, and the n-type current scattering layer 30, which is described later. For example, the trench 6 has the width of from 1.4 μm to 2.0 μm and the depth of more than 2.0 μm (e.g., 2.4 μm). The p-type base region 3 and the n$^+$-type source region 4 are arranged to be in contact with a side wall of the trench 6. Further, an n-type channel layer 7 is formed on an inner surface of the trench 6. For example, the n-type channel layer 7 is doped with an n-type impurity such as phosphorus with a concentration of $1.0 \times 10^{16}/cm^3$. The n-type channel layer 7 is for forming a channel region and has the thickness corresponding to a normally-off type. For example, the n-type channel layer 7 has the thickness of from 0.3 μm to 1.0 μm on the bottom wall of the trench 6 and has the thickness of from 0.1 μm to 0.3 μm on the side wall of the trench 6.

Further, a surface of the n-type channel layer 7 is covered with a gate oxide layer 8. The trench 6 is filled with a gate electrode 9 made of doped polysilicon formed on a surface of the gate oxide layer 8. The gate oxide layer 8 is formed by thermally oxidizing the surface of the n-type channel layer 7 and has the thickness of about 10 nm at each of the bottom wall and the side wall of the trench 6.

In this way, the trench gate structure is formed. This trench gate structure extends in the y-direction of FIG. 1. That is, the longitudinal direction of the trench gate structure is the y-direction of FIG. 1. Multiple trench gate structures are arranged parallel to each other in the x-direction of FIG. 1. Further, each of the n$^+$-type source region 4 and the p$^+$-type body layer 5 extends in the longitudinal direction of the trench gate structure.

The n-type current scattering layer 30 is located between the n$^-$-type drift layer 2 and the p-type base region 3 and in contact with the n-type channel layer 7. For example, the n-type current scattering layer 30 is doped with an n-type impurity such as phosphorus with a concentration of from $2.0 \times 10^{15}/cm^3$ to $1.0 \times 10^7/cm^3$. The impurity concentration of the n-type current scattering layer 30 is higher than that of the n$^-$-type drift layer 2 and preferably higher than that of the n-type channel layer 7. The depth of the n-type current scattering layer 30 is not limited to a specific value. In the embodiment, the n-type current scattering layer 30 has the depth that allows the trench 6 to penetrate the n-type current scattering layer 30. For example, the depth of the n-type current scattering layer 30 can be set to about 0.3 μm.

Further, a p-type deep layer 10 is formed under the p-type base region 3. The p-type deep layer 10 reaches a predetermined depth by penetrating the n-type current scattering layer 30. The p-type deep layer 10 extends in a direction (x-direction in FIG. 1) normal to a portion of the side wall of the trench 6. A channel region is formed in the portion of the side wall of the trench 6. That is, the p-type deep layer 10 extends in a direction perpendicular to the longitudinal direction of the trench 6.

The p-type deep layer 10 includes a lower layer 10a formed in the n$^-$-type drift layer 2 and an upper layer 10b formed in the n-type current scattering layer 30. The p-type deep layer 10 extends deeper than the bottom wall of the trench 6. That is, the p-type deep layer 10 extends deeper than the bottom of the n-type channel layer 7. For example, the depth of the p-type deep layer 10 from the surface of the n$^-$-type drift layer 2 is in the range of from about 2.6 μm to about 3.0 μm, and the depth of the p-type deep layer 10 from the bottom of the p-type base region 3 is in the range of from about 0.9 μm to about 1.3 μm. The width (i.e., dimension in the y-direction of FIG. 1) of the p-type deep layer 10 is in the range of 0.6 μm to 1.0 μm. For example, the p-type deep layer 10 is doped with a p-type impurity such as boron or aluminum with a concentration of from $1.0 \times 10^7/cm^3$ to $1.0 \times 10^{19}/cm^3$. Multiple p-type deep layers 10 are arranged parallel to each other in the longitudinal direction of the trench gate structure. For example, a separation distance between adjacent p-type deep layers 10 is in the range of from 2 μm to 3 μm.

A source electrode 11 and a gate wire (not shown) are formed on the surfaces of the n$^+$-type source region 4, the p$^+$-type body layer 5, and the gate electrode 9. The source electrode 11 and the gate wire are made of multiple metal materials (e.g., Ni/Al). The source electrode 11 and the gate wire can be in ohmic contact with an n-type SiC (specifically, the n$^+$-type source region 4 and the gate electrode 9 that is n-doped). The source electrode 11 and the gate wire can be in ohmic contact with a p-type SiC (specifically, the p$^+$-type body layer 5 and the gate electrode 9 that is p-doped). The source electrode 11 and the gate wire are formed on an interlayer insulating film 12 for electrical insulation. The source electrode 11 is in electrical contact with the n$^+$-type source region 4 and the p+-type body layer 5 through a contact hole formed in the interlayer insulating film 12. The gate wire is in electrical contact with the gate electrode 9 through the contact hole.

A drain electrode 13 is formed on a back side of the n+-type substrate 1 and in electrical contact with the n+-type substrate 1. In this way, an n-channel accumulation-mode trench-gate MOSFET is formed.

The accumulation-mode trench-gate MOSFET operates in the following manner.

In a case where SiC has a high impurity concentration of, for example, $1.0 \times 10^{19}/cm^3$, SiC has an inner potential of about 3V before a gate voltage is applied to the gate electrode 9. Therefore, even when a potential of the source electrode 11 is 0V, the p-type base region 3 acts as a potential of minus 3V. As a result, a depletion layer extends from the p-type base region 3, and a portion near the p-type base region 3 acts as an insulator. Therefore, even when a positive voltage is applied to the drain electrode 13, the n-type channel layer 7 acts as an insulator. As a result, since electrons cannot reach the n-type channel layer 7, an electric current does not flow between the source electrode 11 and the drain electrode 13.

In an OFF state (gate voltage=0V, drain voltage=650V, source voltage=0V), even when a voltage is applied to the drain electrode 13, a depletion layer extends from between the p-type base region 3 and the n−-type drift layer 2 (including the n-type channel layer 7) due to reverse bias. In this case, since the concentration of the p-type base region 3 is much greater than that of the n−-type drift layer 2, most of the depletion layer extends toward the n−-type drift layer 2 side. For example, when the concentration of the p-type base region 3 is ten times greater than that of the n−-type drift layer 2 as in the present embodiment, the depletion layer extends toward the p-type base region 3 side by about 0.7 μm and toward the n−-type drift layer 2 side by about 7.0 μm. However, since the thickness of the p-type base region 3 is 2.0 μm that is greater than the amount of extension of the depletion layer, punch through can be prevented. Further, the depletion layer extends as compared to when the drain voltage is 0V. Accordingly, since the portion acting as an insulator more extends, an electric current does not flow between the source electrode 11 and the drain electrode 13.

Further, since the gate voltage is 0V, an electric field is produced between the drain and the gate. Therefore, there is a possibility that electric field concentration may occur at the bottom of the gate oxide layer 8. However, since the p-type deep layer 10 extends deeper than the trench 6, the depletion layer greatly extends toward the n−-type drift layer 2 side at the PN junction between the p-type deep layer 10 and the n−-type drift layer 2. Therefore, it is less likely that a high voltage due to the drain voltage is applied to the gate oxide layer 8. In particular, the amount of extension of the depletion layer toward the n−-type drift layer 2 side can be increased by making the impurity concentration of the p-type deep layer 10 higher than that of the p-type base region 3. Thus, electric field concentration in the gate oxide layer 8 can be reduced, in particular, on the bottom wall of the trench 6, so that a breakdown of the gate oxide layer 8 can be prevented.

A result of a simulation indicates that the electric field strength in the gate oxide layer 8 is 2.0 MV/cm at the bottom wall of the trench 6 when a voltage of 650V is applied to the drain electrode 13. The gate oxide layer 8 can withstand this electric field strength of 2.0 MV/cm. Therefore, even when the voltage of 650V is applied to the drain electrode 13, the gate oxide layer 8 is not, broken so that a breakdown voltage of 650V can be achieved.

In the present embodiment, the p-type deep layer 10, which provides the effect of reducing the electric field, is formed in the n-type current scattering layer 30. Further, the p-type deep layer 10 is connected to the p-type base region 3 so that the p-type deep layer 10 can be fixed to a source potential. Therefore, a reduction in the effect of reducing the electric field can be prevented. If the p-type deep layer 10 and the p-type base region 3 are divided by the p-type deep layer 10, it becomes impossible to directly draw a surge current from the p-type deep layer 10 to the p-type base region 3. Therefore, there is a possibility that an electric current may flow through a PNP junction constructed with these portions, and a large electric current may flow due to the PNP junction acting as a transistor. As a result; an element breakdown may occur. However, since the p-type deep layer 10 is connected to the p-type base region 3, it is possible to prevent such an element breakdown from occurring.

On the other hand, in an ON state (gate voltage=20V, drain voltage=1V, source voltage=0V), a voltage of 20V is applied to the gate electrode 9 so that the n-type channel layer 7 can serve as an accumulation-mode channel. Therefore, electrons injected from the source electrode 11 reach the n−-type drift layer 2 by passing through the n+-type source region 4 and the n-type channel layer 7. Thus, an electric current flows between the source electrode 11 and the drain electrode 13.

In this case, an on-resistance is 4.9 mΩ·cm², which is 15% greater than an on-resistance of 4.3 mΩ·cm² of a case where the p-type deep layer 10 of the present embodiment is not formed. This is because a channel is not formed at the side wall of the trench gate structure where the p-type deep layer 10 is formed. However, the increase in the on-resistance is not large and also can be adjusted by adjusting the width of the p-type deep layer 10 and the separation distance between adjacent p-type deep layer 10. Therefore, the increase in the on-resistance is not a big problem.

Next, a method of making the trench-gate MOSFET shown in FIG. 1 is described. FIGS. 3A-10B are cross-sectional views illustrating processes for making the trench-gate MOSFET shown in FIG. 1. Each of FIGS. 3A, 4A, 5A, 6A, 7A, 8A, 9A, and 10A is a cross-sectional view taken along the line IIA-IIA in parallel to the xz plane of FIG. 1 and corresponds to FIG. 2A. Each of FIGS. 3B, 4B, 5B, 6B, 7B, 8B, 9B, and 10B is a cross-sectional view taken along the line IID-IID in parallel to the yz plane of FIG. 1 and corresponds to FIG. 2D. The method is described below with reference to these drawings.

Figure 3A:
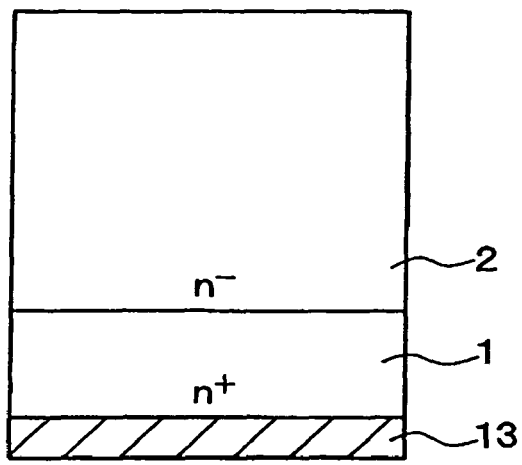
FIGS. 3A and 3B are diagrams illustrating a process of making the MOSFET of FIG. 1.
Figure 3B:
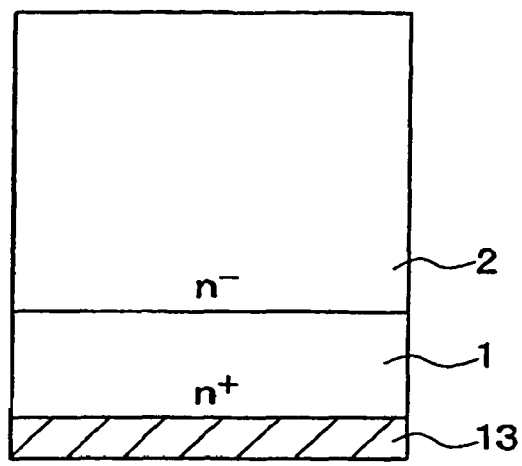

(Process Shown in FIGS. 3A and 3B)

Firstly, the n+-type substrate 1 having the thickness of, for example, about 300 μm and doped with an n-type impurity such as phosphorus with a concentration of, for example, $1.0 \times 10^{19}/cm^3$ is prepared. After the drain electrode 13 is formed on the back side of the n+-type substrate 1, the n−-type drift layer 2 of SiC is epitaxially grown on the surface of the n+-type substrate 1. For example, the n-type drift layer 2 has the thickness of about 15 μm and is doped with an n-type impurity such as phosphorus with a concentration of from about $3.0 \times 10^{15}/cm^3$ to about $7.0 \times 10^{15}/cm^3$.

Figure 4A:
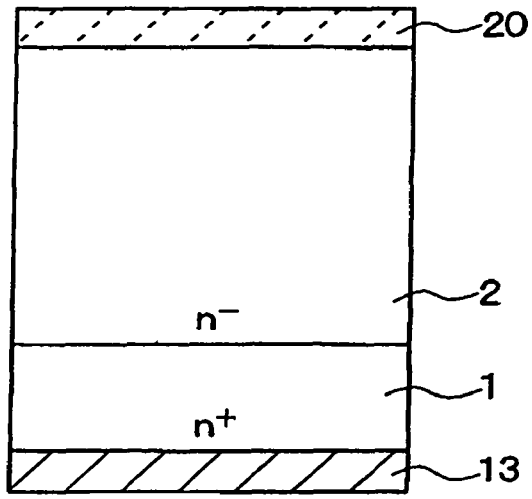
FIGS. 4A and 4B are diagrams illustrating a process following the process of FIGS. 3A and 3B.
Figure 4B:
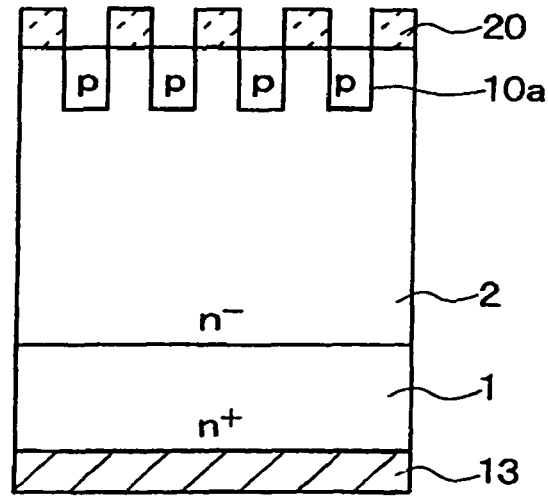

(Process Shown in FIGS. 4A and 4B)

After a mask 20 made of LTO or the like is formed on the surface of the n−-type drift layer 2, an opening is formed through a photolithography process in the mask 20 at a position where the p-type deep layer 10 is to be formed. Then, ion implantation and activation of a p-type impurity (e.g., boron or aluminum) are performed through the mask 20 to form the lower layer 10a of the p-type deep layer 10. For example, the lower layer 10a has the thickness of from about 0.6 μm to about 1.0 μm and the width of from about 0.6 μm to about 1.0

μm and is doped with boron or aluminum with a concentration of from about $1.0 \times 10^{17}/cm^3$ to about $1.0 \times 10^{19}/cm^3$. Then, the mask 20 is removed.

Figure 5A:
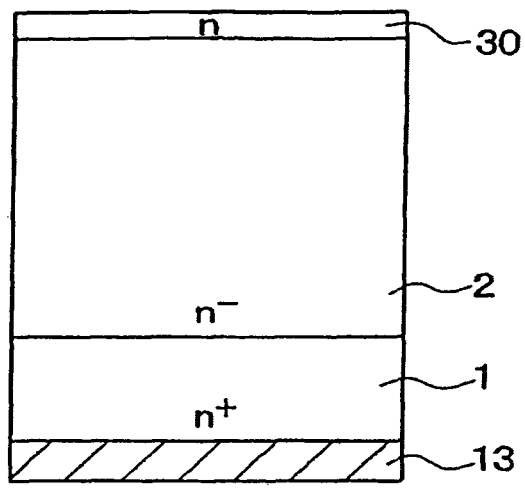
FIGS. 5A and 5B are diagrams illustrating a process following the process of FIGS. 4A and 4B.
Figure 5B:
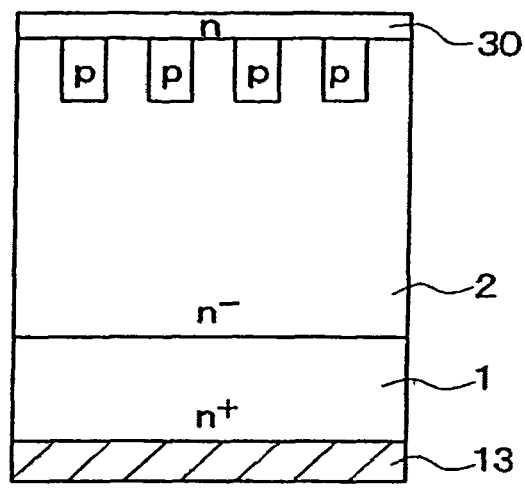

(Process Shown in FIGS. 5A and 5B)

The n-type current scattering layer 30 is epitaxially grown on the surfaces of the n⁻-type drift layer 2 and the p-type deep layer 10. For example, the n-type current scattering layer 30 has the thickness of, for example, 0.3 μm. In this case, the n-type current scattering layer 30 is doped with an n-type impurity such as phosphorus with a concentration of, for example, from $2.0 \times 10^{15}/cm^3$ to $1.0 \times 10^{17}/cm^3$ so that the concentration of the n-type current scattering layer 30 can be higher than that of the n⁻-type drift layer 2, preferably, the n-type channel layer 7.

Figure 6A:
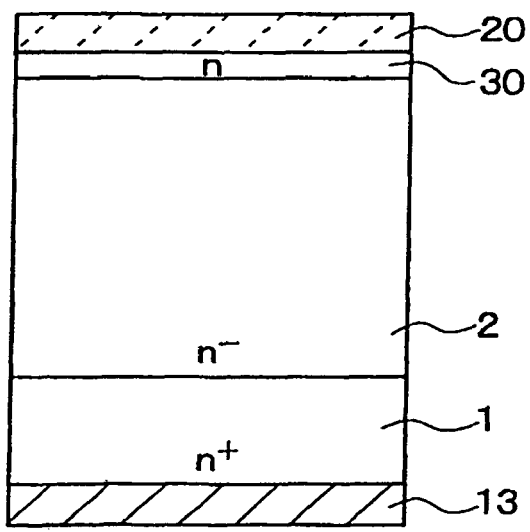
FIGS. 6A and 6B are diagrams illustrating a process following the process of FIGS. 5A and 5B.
Figure 6B:
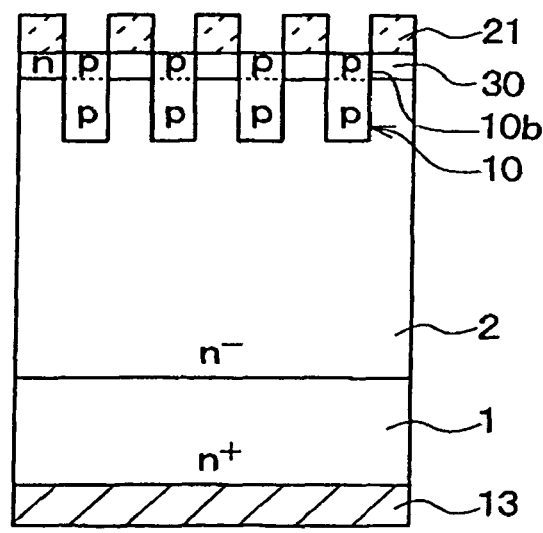

(Process Shown in FIGS. 6A and 6B)

After a mask 21 is formed on the surface of the n-type current scattering layer 30, an opening is formed through a photolithography process in the mask 21 at a position where the p-type deep layer 10 is to be formed. Then, ion implantation and activation of a p-type impurity (e.g., boron or aluminum) are performed through the mask 21 to form the upper layer 10b of the p-type deep layer 10. In this case, the p-type impurity concentration and the width of the upper layer 10b are made substantially equal to the p-type impurity concentration and the width of the lower layer 10a. In this way, the lower layer 10a and the upper layer 10b are joined together to form the p-type deep layer 10. Then, the mask 21 is removed.

Figure 7A:
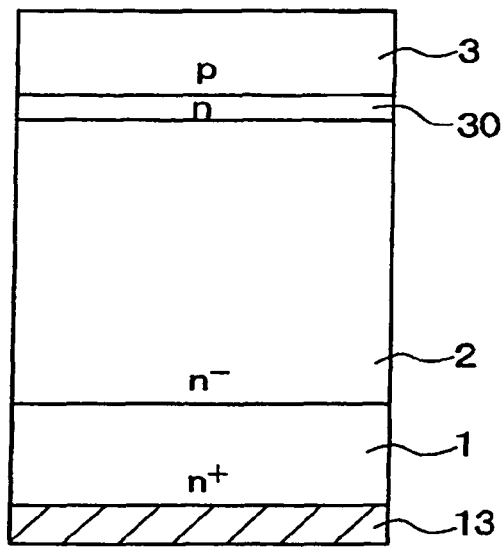
FIGS. 7A and 7B are diagrams illustrating a process following the process of FIGS. 6A and 6B.
Figure 7B:
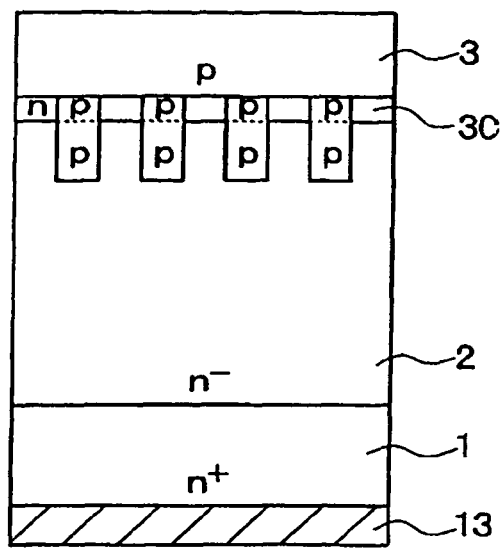

(Process Shown in FIGS. 7A and 7B)

A p-type impurity layer is epitaxially grown on the surface of the n⁻-type drift layer 2 to form the p-type base region 3. For example, the p-type impurity layer has the thickness of about 2.0 μm and is doped with a p-type impurity such as boron or aluminum with a concentration of from about $5.0 \times 1^{6}/cm^3$ to about $2.0 \times 10^{19}/cm^3$.

Figure 8A:
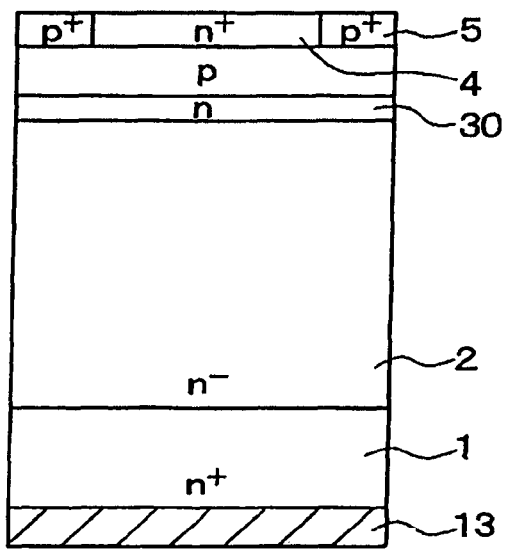
FIGS. 8A and 8B are diagrams illustrating a process following the process of FIGS. 7A and 7B.
Figure 8B:
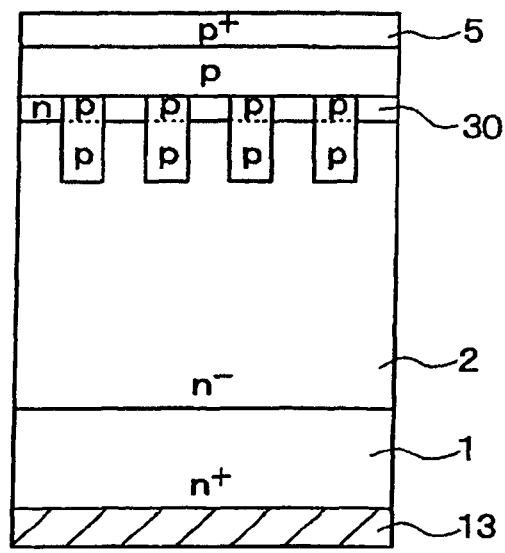

(Process Shown in FIGS. 8A and 8B)

After a mask (not shown) made of, for example, LTO is formed on the p-type base region 3, an opening is formed through a photolithography process in the mask 21 at a position where the n⁺-type source region 4 is to be formed. Then, ion implantation of an n-type impurity (e.g., phosphorus) is performed. Next, after the mask is removed, another mask (not shown) is formed. Then, an opening is formed through a photolithography process in the other mask at a position where the p⁺-type body layer 5 is to be formed. Then, ion implantation of a p-type impurity (e.g., boron or aluminum) is performed. Then, the implanted ions are activated so that the n⁺-type source region 4 and the p⁺-type body layer 5 can be formed. For example, the n⁺-type source region 4 has the thickness of about 0.3 μm and is doped with an n-type impurity such as phosphorus with a concentration (surface concentration) of about $1.0 \times 10^{21}/cm^3$. For example, the p⁺-type body layer 5 has the thickness of about 0.3 μm and is doped with a p-type impurity such as boron or aluminum with a concentration (surface concentration) of about $1.0 \times 10^{21}/cm^3$. Then, the other mask is removed.

Figure 9A:
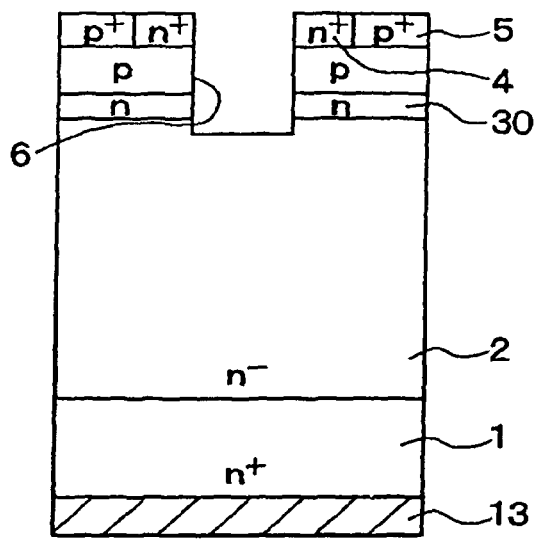
FIGS. 9A and 9B are diagrams illustrating a process following the process of FIGS. 8A and 8B.
Figure 9B:
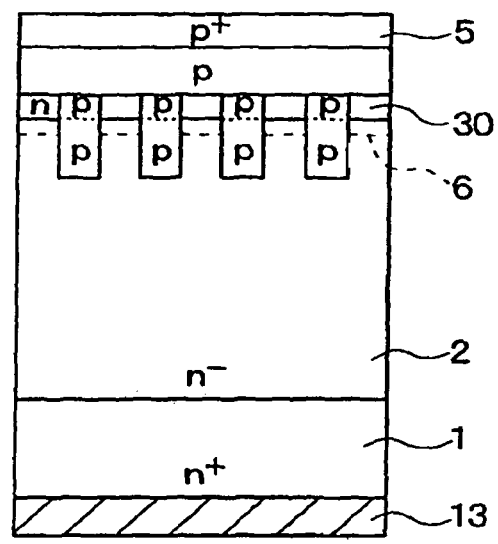

(Process Shown in FIGS. 9A and 9B)

After an etching mask (not shown) is formed on the p-type base region 3, n⁺-type source region 4, and the p⁺-type body layer 5, an opening is formed in the etching mask at a position where the trench 6 is to be formed. Then, an anisotropic etching is performed by using the etching mask to form the trench 6. If necessary, an isotropic etching and a sacrifice oxidation can be performed subsequent to the anisotropic etching. Then, the etching mask is removed.

Figure 10A:
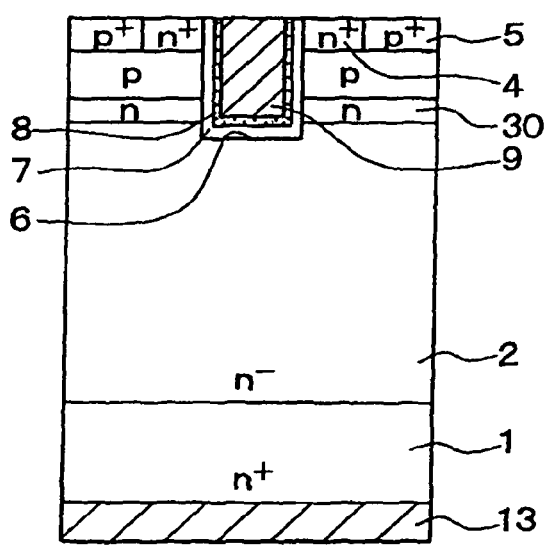
FIGS. 10A and 10B are diagrams illustrating a process following the process of FIGS. 9A and 9B.
Figure 10B:
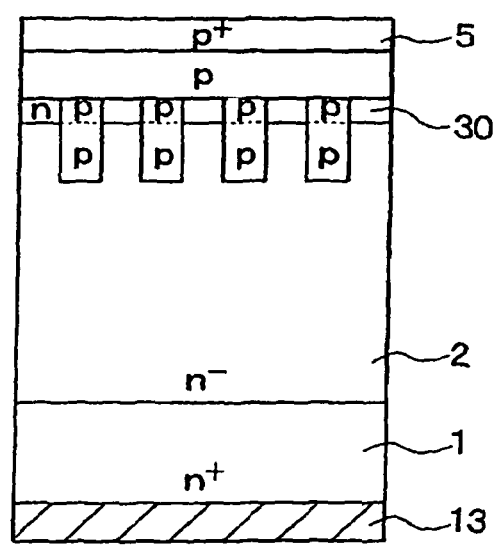

(Process Shown in FIGS. 10A and 10B)

The n-type channel layer 7 is epitaxially grown on the entire surface of the substrate including the trench 6. For example, the n-type channel layer 7 is doped with an n-type impurity such as phosphorus with a concentration of about $1.0 \times 10^{16}/cm^3$. In this case, due to, for example, the dependence of the epitaxial growth on the face direction, the thickness of the n-type channel layer 7 becomes greater on the bottom wall of the trench 6 than on the side wall of the trench 6. Next, after unnecessary portions of the n-type channel layer 7, i.e., portions formed on the p-type base region 3, n⁺-type source region 4, and the p⁺-type body layer 5 are removed, the gate oxide layer 8 is formed by performing a gate oxide layer forming process. Specifically, the gate oxide layer 8 is formed by gate oxidation (thermal oxidation) achieved by a pyrogenic technique in wet atmosphere.

Then, a polysilicon layer doped with an n-type impurity and having the thickness of about 440 nm is formed on the surface of the gate oxide layer 8 at a temperature of about 600° C. Then, an etch back process is performed so that the gate oxide layer 8 and the gate electrode 9 can be left in the trench 6.

Processes following the above-described processes are not shown in the drawings, because the following processes are the same as the conventional processes. Specifically, after the interlayer insulating layer 12 is formed, the interlayer insulating layer 12 is patterned to form a contact hole leading to the n⁺-type source region 4 and the p⁺-type body layer 5 and also patterned to form a contact hole leading to the gate electrode 9 on a different cross-section. Next, an electrode material is formed to fill the contact holes and then patterned to form the source electrode 11 and the gate wire. In this way, the MOSFET shown in FIG. 1 is completed.

According to the above-described method, the lower layer 10a and the upper layer 10b of the p-type deep layer 10 are separately formed. In such an approach, the p-type deep layer 10 can be formed deep, as compared to when the p-type deep layer 10 is formed at a time. Further, there is no need to increase energy needed to perform ion implantation, because the lower layer 10a and the upper layer 10b of the p-type deep layer 10 are separately formed. Accordingly, there is no need to prepare an ion implantation apparatus that can perform ion implantation by using an enormous amount of energy.

Further, since the method allows the p-type deep layer 10 to be formed deeper, it is ensured that the bottom of the p-type deep layer 10 is located deeper than the bottom wall of the trench 6. Therefore, there is no need to perform a trench depth control, which is difficult to perform.

The deep layer 10 is formed by performing ion implantation from the surface of the current scattering layer 30. In such a case, since the ion implantation is performed at high energy, a defect may occur due to the ion implantation. However, according to the present embodiment, there is no need to perform ion implantation at high energy. Therefore, the defect due to the ion implantation can be prevented.

By the way, it is assumed that the longitudinal direction of the trench 6 is arranged in parallel to the longitudinal direction of the p-type deep layer 10. In such a case, device characteristics are affected, if a separation distance between the trench 6 and the p-type deep layer 10 is not uniform. Therefore, it becomes important that a mask used to form the trench 6 is aligned with a mask used to from the p-type deep layer 10. Since there will naturally occur some misalignment between the masks, it is impossible to completely eliminate the influence of the misalignment on the device characteristics. In contrast, according to the SiC semiconductor device of the present embodiment, the longitudinal direction of the trench 6 is arranged perpendicular to the longitudinal direction of the p-type deep layer 10 to prevent the misalignment from affecting the device characteristics. Therefore, characteristic variations between products are prevented so that yield rates can be improved.

Second Embodiment

A second embodiment of the present invention is described. A difference between the first and second embodiments is a relationship between the lower layer 10a and the upper layer 10b of the p-type deep layer 10. Since a basic structure is the same between the first and second embodiments, only the difference is described.

Figure 11:
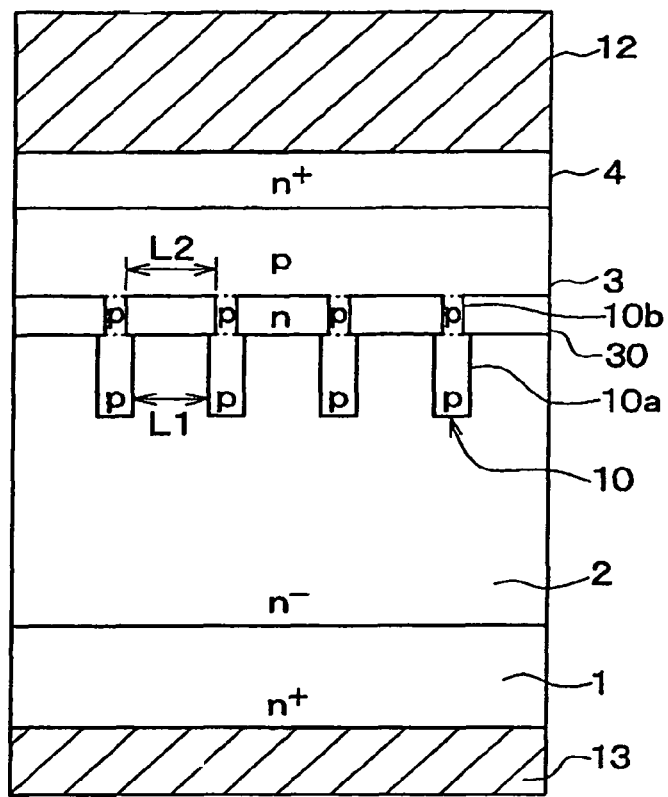
FIG. 11 is a diagram illustrating a cross-sectional view of an accumulation-mode trench-gate MOSFET according to a second embodiment of the present invention.

FIG. 11 is a diagram illustrating a cross-sectional view of a trench-gate MOSFET of a SiC semiconductor device according to the second embodiment. Portions of the second embodiment corresponding to the portions shown in FIG. 1 and FIGS. 2A-2C are almost the same as those of the first embodiment, and a portion of the second embodiment corresponding to the portion shown in FIG. 2D is different than that of the first embodiment. FIG. 11 is a cross-sectional view of the portion corresponding to the portion shown in FIG. 2D.

As shown in FIG. 11, a separation distance L2 between adjacent upper layers 10b is greater than a separation distance L1 between adjacent lower layers 10a. In such an approach, a current path in the current scattering layer 30 becomes wider so that an on-current can be increased. The SiC semiconductor device having such a structure can be made by modifying the size and separation distance of the opening formed in the mask 21 of the first embodiment.

Third Embodiment

A third embodiment of the present invention is described. A difference between the first and third embodiments is a relationship between the lower layer 10a and the upper layer 10b of the p-type deep layer 10. Since a basic structure is the same between the first and third embodiments, only the difference is described.

Figure 12:
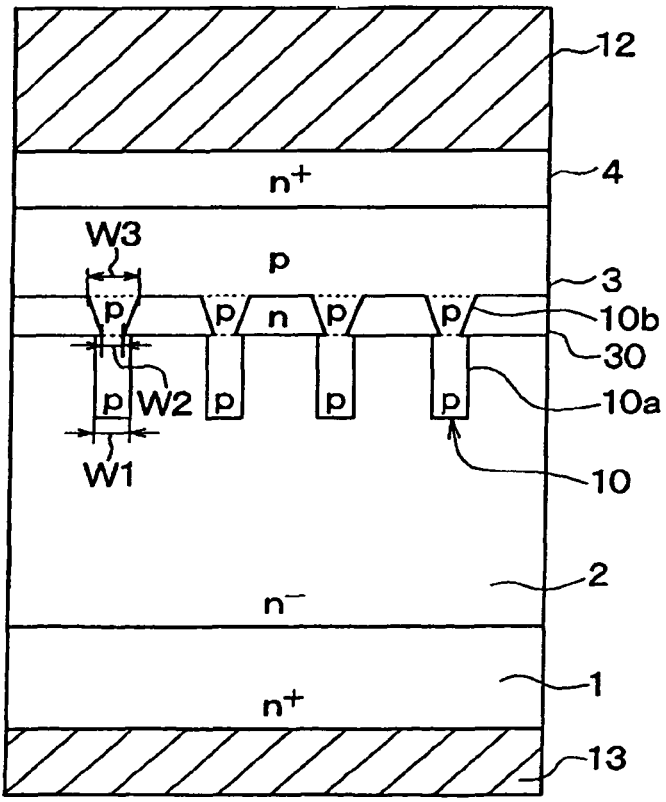
FIG. 12 is a diagram illustrating a cross-sectional view of an accumulation-mode trench-gate MOSFET according to a third embodiment of the present invention.

FIG. 12 is a diagram illustrating a cross-sectional view of a trench-gate MOSFET of a SiC semiconductor device according to the third embodiment. Portions of the third embodiment corresponding to the portions shown in FIG. 1 and FIGS. 2A-2C are almost the same as those of the first embodiment, and a portion of the third embodiment corresponding to the portion shown in FIG. 2D is different than that of the first embodiment. FIG. 12 is a cross-sectional view of the portion corresponding to the portion shown in FIG. 2D.

As shown in FIG. 12, a width W2 of a bottom side of the upper layer 10b is less than a width W1 of the lower layer 10a, and a width W3 of a surface side of the upper layer 10b is greater than the width W1 of the lower layer 10a. In such an approach, the current path in the current scattering layer 30 becomes wider, and a surge current resistance becomes small. The SiC semiconductor device having such a structure can be made by causing the opening formed in the mask 21 of the first embodiment to have a taper shape. For example, using isotropic etching such as wet etching in the photolithography process for forming the opening of the mask 21 can allow the opening to have a taper shape.

Fourth Embodiment

A fourth embodiment of the present invention is described below. A difference between the fourth embodiment and the first to third embodiments is in that a MOSFET is inversion-mode. Since a basic structure is the same between the fourth embodiment and the first to third embodiments, only the difference is described.

Figure 13:
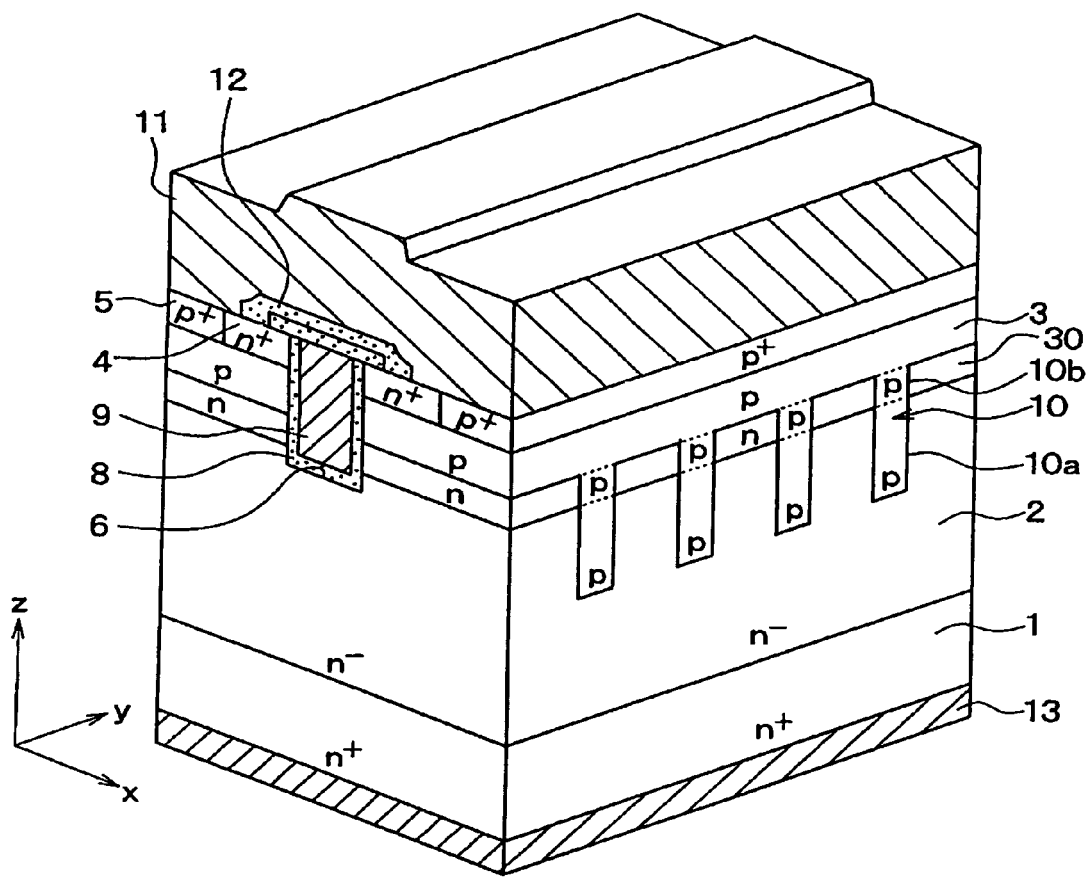
FIG. 13 is a, diagram illustrating a cross-sectional view of an inversion-mode trench-gate MOSFET according to a fourth embodiment of the present invention.

FIG. 13 is a diagram illustrating a perspective cross-sectional view of a trench-gate MOSFET of a SiC semiconductor device of the fourth embodiment. Although FIG. 13 illustrates a structure formed by modifying the MOSFET of the first embodiment to an inversion-mode MOSFET, each of the MOSFETs of the second and third embodiment can be modified to an inversion-mode MOSFET.

In the fourth embodiment, as shown in FIG. 13, the gate oxide layer 8 is formed on the surface of the trench 6, and the n-type channel layer 7 of the first embodiment is not formed. Therefore, the gate oxide layer 8 is in contact with the p-type base region 3 and the $n^+$-type source region 4 at the side wall of the trench 6.

In the MOSFET having such a structure, when a gate voltage is applied to the gate electrode 9, a portion of the p-type base region 3 in contact with the gate oxide layer 8 located on the side wall of the trench 6 becomes an inversion-mode channel so that an electric current can flow between the source electrode 11 and the drain electrode 13.

Like the first embodiment, the p-type deep layer 10 is formed in the inversion-mode MOSFET. Therefore, when a high voltage is applied as a drain voltage, the depletion layer greatly extends toward the $n^-$-type drift layer 2 side at the PN junction between the p-type deep layer 10 and the $n^-$-type drift layer 2. Therefore, it is less likely that the high voltage due to the drain voltage is applied to the gate oxide layer 8. Thus, electric field concentration in the gate oxide layer 8 can be reduced, in particular, on the bottom wall of the trench 6, so that a breakdown of the gate oxide layer 8 can be prevented.

Since the lower layer 10a and the upper layer 10b of the p-type deep layer 10 are separately formed, the same advantage as the first embodiment can be achieved.

A method of making the SiC semiconductor device having such an inversion-mode MOSFET is basically the same as the method of making the SiC semiconductor device of the first embodiment. A difference between the methods is in that the process for forming the n-type channel layer 7 is eliminated, and the gate oxide layer 8 is formed directly on the trench 6.

(Modifications)

The embodiments described above can be modified in various ways. For example, in the above described embodiments, the MOSFET is of n-channel type, a n-conductivity type is defined as a first conductivity type, and a p-conductivity type is defined as a second conductivity type. Alternatively, the present invention can be applied to a p-channel MOSFET by inversing the conductivity type of each element. Although a trench-gate MOSFET is taken as an example of the embodiments, the present invention can be applied to a trench-gate IGBT by changing the conductivity type of the substrate 1 of the first and second embodiments from a n-conductivity type to a p-conductivity type.

In the embodiments, the p-type base region 3 and the $n^+$-type source region 4 are formed before the trench 6 is formed. Alternatively, the p-type base region 3 and the $n^+$-type source region 4 can be formed by ion implantation after the trench 6 is formed. In a case where the $n^+$-type source region 4 is formed by ion implantation, it does not matter whether the $n^+$-type source region 4 is in contact with the gate oxide layer 8. Further, in a case where the p-type base region 3 is formed by ion implantation, the p-type base region 3 can be spaced from the side wall of the trench 6. Therefore, a portion of the $n^-$-type drift layer 2 located between the side wall of the trench 6 and the p-type base region 3 can be caused to act as the n-type channel layer 7. In this case, it does not matter whether the p-type base region 3 and the n+-type source region 4 are formed before or after the trench 6 is formed.

In the embodiments, the n+-type source region 4 and the p+-type body layer 5 are formed by ion implantation. Alternatively, any one of the n+-type source region 4 and the p+-type body layer 5 can be formed by epitaxial growth.

In the embodiments, the p-type base region 3 is electrically connected to the source electrode 11 via the p+-type body layer 5. Alternatively, the p+-type body layer 5 can be formed as a simple contact portion for electrically connecting the p-type base region 3 and the source electrode 11. The gate oxide layer 8 formed by thermal oxidation is used as a gate insulating layer. Alternatively, the gate insulating layer can include a nitride layer or an oxide layer that is formed by a method other than thermal oxidation. Further, the drain electrode 13 can be formed, after the source electrode 11 is formed.

What is claimed is:

1. A method of making a silicon carbide semiconductor device having an accumulation mode MOSFET in which an accumulation mode channel formed in a channel layer by control of an application voltage to a gate electrode is controlled so that an electronic current flows between a source electrode and a drain electrode through a source region and a drift layer, the method comprising:
   preparing a substrate made of silicon carbide and having a first or second conductivity type;
   forming the drift layer on the substrate, the drift layer being made of silicon carbide and having the first conductivity type, an impurity concentration of the drift layer being lower than an impurity concentration of the substrate;
   forming a current scattering layer on the drift layer, the current scattering layer being made of silicon carbide and having the first conductivity type, an impurity concentration of the current scattering layer being higher than an impurity concentration of the drift layer;
   forming a base region on the current scattering layer, the base region being made of silicon carbide and having the second conductivity type;
   forming the source region on the base region, the source region being made of silicon carbide and having the first conductivity type, an impurity concentration of the source region being higher than the impurity concentration of the drift layer;
   forming a trench extending deeper than the source region and the base region to reach the current scattering layer or the drift layer, the source region and the base region being located on each side of the trench;
   forming the channel layer on a side wall of the trench, the channel layer being made of silicon carbide and having the first conductivity type;
   forming a gate insulating layer on a surface of the channel layer, the gate insulating layer being spaced from the base region by a predetermined distance;
   forming the gate electrode on the gate insulating layer inside the trench;
   forming the source electrode electrically connected to the source region and the base region;
   forming the drain electrode on a back side of the substrate; and
   forming a deep layer located under the base region and reaching the drift layer by penetrating the current scattering layer, the deep layer extending deeper than the trench and extending in a direction of the normal to the side wall of the trench, the deep layer having the second conductivity type, wherein
   the forming the deep layer includes forming a lower layer of the deep layer and an upper layer of the deep layer, the lower layer extending in one direction, the upper layer being located at a position corresponding to the lower layer and connected to the lower layer,
   the forming the lower layer includes placing a first mask on a surface of the drift layer and performing ion implantation using the first mask, and
   the forming the upper layer includes placing a second mask on a surface of the current scattering layer and performing ion implantation using the second mask.

2. The method according to claim 1, wherein
   the forming the upper layer further includes making a separation distance between adjacent upper layers greater than a separation distance between adjacent lower layers.

3. The method according to claim 1, wherein
   the forming the upper layer further includes making the width of a bottom portion of the upper layer less than the width of the lower layer and making the width of a surface portion of the upper layer greater than the width of the lower layer.

4. A method of making a silicon carbide semiconductor device having an inversion mode MOSFET in which an inversion mode channel formed in a surface portion of a base region located at a side wall of a trench by control of an application voltage to a gate electrode is controlled so that an electronic current flows between a source electrode and a drain electrode through a source region and a drift layer, the method comprising:
   preparing a substrate made of silicon carbide and having a first or second conductivity type;
   forming the drift layer on the substrate, the drift layer being made of silicon carbide and having the first conductivity type, an impurity concentration of the drift layer being lower than an impurity concentration of the substrate;
   forming a current scattering layer on the drift layer, the current scattering layer being made of silicon carbide and having the first conductivity type, an impurity concentration of the current scattering layer being higher than an impurity concentration of the drift layer;
   forming a base region on the current scattering layer, the base region being made of silicon carbide and having the second conductivity type;
   forming the source region on the base region, the source region being made of silicon carbide and having the first conductivity type, an impurity concentration of the source region being higher than the impurity concentration of the drift layer;
   forming the trench extending deeper than the source region and the base region to reach the current scattering layer or the drift layer, the source region and the base region being located on each side of the trench;
   forming a gate insulating layer on a surface of the trench;
   forming the gate electrode on the gate insulating layer inside the trench;
   forming the source electrode electrically connected to the source region and the base region;
   forming the drain electrode on a back side of the substrate; and
   forming a deep layer located under the base region and reaching the drift layer by penetrating the current scattering layer, the deep layer extending deeper than the trench and extending in a direction of the normal to the side wall of the trench, the deep layer having the second conductivity type, wherein the forming the deep layer includes forming a lower layer of the deep layer and an upper layer of the deep layer, the lower layer extending in one direction, the upper layer being located at a position corresponding to the lower layer and connected to the lower layer, the forming the lower layer includes placing a first mask on a surface of the drift layer and performing ion implantation using the first mask, and the forming the upper layer includes placing a second mask on a surface of the current scattering layer and performing ion implantation using the second mask.

5. The method according to claim 4, wherein
the forming the upper layer further includes making a separation distance between adjacent upper layers greater than a separation distance between adjacent lower layers.

6. The method according to claim 4, wherein
the forming the upper layer further includes making the width of a bottom portion of the upper layer less than the width of the lower layer and making the width of a surface portion of the upper layer greater than the width of the lower layer.

* * * * *